(12) United States Patent
Weiß et al.

(10) Patent No.: US 11,431,272 B2
(45) Date of Patent: Aug. 30, 2022

(54) ENERGY RECOVERY CIRCUITRY

(71) Applicant: Bühler Motor GmbH, Nuremberg (DE)

(72) Inventors: Jens Weiß, Fürth (DE); Gerhard Walter, Rednitzhembach (DE)

(73) Assignee: BÜHLER MOTOR GMBH, Nuremberg (DE)

( * ) Notice: Subject to any disclaimer, the term of this patent is extended or adjusted under 35 U.S.C. 154(b) by 248 days.

(21) Appl. No.: 16/783,344

(22) Filed: Feb. 6, 2020

(65) Prior Publication Data

US 2020/0259442 A1 Aug. 13, 2020

(30) Foreign Application Priority Data

Feb. 12, 2019 (DE) .................... 10 2019 201 775.4

(51) Int. Cl.
| | |
|---|---|
| *H02P 29/60* | (2016.01) |
| *H02P 25/18* | (2006.01) |
| *H02P 23/24* | (2016.01) |
| *H02P 27/04* | (2016.01) |
| *H02P 25/03* | (2016.01) |
| *H02P 29/032* | (2016.01) |

(Continued)

(52) U.S. Cl.
CPC .............. *H02P 27/04* (2013.01); *F04D 13/06* (2013.01); *H02P 25/03* (2016.02); *H02P 29/032* (2016.02); *H02P 29/68* (2016.02)

(58) Field of Classification Search
CPC ................................. H02P 23/14; H02P 23/06
See application file for complete search history.

(56) References Cited

U.S. PATENT DOCUMENTS 4,707,650 A * 11/1987 Bose ....................... H02P 3/065
                                                         318/685
5,075,610 A * 12/1991 Harris ................... H02P 25/089
                                                         318/701
(Continued)

FOREIGN PATENT DOCUMENTS

DE    692 19 812 T2    11/1997
DE    697 16 086 T2     6/2003
(Continued)

OTHER PUBLICATIONS

Search Report dated Dec. 20, 2019, issued in counterpart German Patent Application No. 10 2019 201 775.4 (6 pages).

*Primary Examiner* — Muhammad S Islam
*Assistant Examiner* — Charles S Laughlin
(74) *Attorney, Agent, or Firm* — WHDA, LLP

(57) ABSTRACT

An energy recovery circuitry for an electric motor with a single phase winding, consisting of two coil sections with central connection, whereby the two coil ends of the coil sections are each connected to ground via a switching element. The task of the invention is therefore, for an electric motor of this type, to ensure, a significantly higher efficiency, a better and defined switching of the coil switching elements, a thermal relief for the switching elements, improved and smoother running, reduced warming of the printed circuit board, improved EMC characteristics, a more robust design of the overall switching, a focused conduction of the losses and an extra protection against any surge impulses from a mains network.

14 Claims, 2 Drawing Sheets

(51) Int. Cl.
*H02P 29/68* (2016.01)
*F04D 13/06* (2006.01)

(56) References Cited

U.S. PATENT DOCUMENTS

| | | | | |
|---|---|---|---|---|
| 5,087,170 A | * | 2/1992 | Kousokabe | F25B 31/002 |
| | | | | 415/110 |
| 6,140,729 A | | 10/2000 | Pollock et al. | |
| 6,693,403 B2 | * | 2/2004 | Chen | H02P 25/08 |
| | | | | 318/701 |
| 7,852,038 B2 | * | 12/2010 | Ramu | H02P 25/04 |
| | | | | 318/701 |
| 2014/0049215 A1 | | 2/2014 | Fassnacht | |

FOREIGN PATENT DOCUMENTS

| | | |
|---|---|---|
| DE | 44 06 546 B4 | 4/2006 |
| DE | 10 2008 008 561 A1 | 8/2009 |
| DE | 10 2009 056 910 A1 | 7/2010 |
| DE | 10 2010 042 328 A1 | 4/2012 |

* cited by examiner

ENERGY RECOVERY CIRCUITRY

CROSS-REFERENCE TO RELATED APPLICATIONS

The present patent application claims priority from, German Application No. DE 10 2019 201 775.4, filed Feb. 12, 2019, and which is incorporated herein by reference in entirety.

BACKGROUND OF THE INVENTION

(1) Field of the Invention

The invention concerns an energy recovery circuitry for an electric motor with a single phase winding, consisting of two coil sections with central connection, wherein the two coil ends of the coil sections are each connected to ground via a switching element.

(2) Description of Related Art Including Information Disclosed Under 37 CFR 1.97 and 1.98

A commutation of an electric motor of this type is realized in that both the switching elements are switched alternately, synchronous to the motor's speed of rotation. As a result of the alternate switching, a rotating field is generated in the electric motor's stator which drags a permanent magnet rotor. This kind of switching is also called M-switching. When the motor winding is switched the remaining electrical energy stored in the respective coil section must be discharged. Since no overrun exists for this kind of connection, the voltage on the switching element rises up to its avalanche voltage and the current flows further to ground via this switching element. This results in a rapid increase in the current. In doing so the electric loss of power can be calculated, from the time during which the impulse is active, from the avalanche voltage and the current that flows. Since the avalanche breakdown is very energy intensive the components are subjected to a very high thermal stress. The tolerances for the thermal resistance of switching elements are, for economic reasons, very limited. If a higher motor power is desired then the thermal destruction of the components must be expected. The avalanche breakdowns described cause a large part of the total losses and thus significantly reduce the overall efficiency.

The switching elements, such as MOSFETs are, as a rule, controlled via micro-controllers. The available voltage, however, is not sufficient to switch the MOSFETs through correctly and as defined.

BRIEF SUMMARY OF THE INVENTION

The task of the invention is therefore, for an electric motor of this type, to ensure, a higher efficiency, a better and defined switching of the coil switching elements, a thermal relief for the switching elements, improved and smoother running, reduced warming of the printed circuit board, improved EMC characteristics, a more robust design of the overall switching, a focused conduction of the losses and an extra protection against any surge impulses from a mains network.

This object is achieved according to the invention as follows. Since during operation a part of the energy stored in the coil sections is diverted via a diode into a storage capacitor when the switching element is switched off, which capacitator, as a result, is charged and buffers the energy recovered, a part of the switch-off energy can be diverted from the switching element which is then thermally relieved.

The energy buffered in the charged storage capacitor generates an output voltage, the level of which can be stabilized at e.g. 15 V, by a Z-diode connected in parallel to the storage capacitor. The output voltage serves as an input voltage for an application, circuitry or partial circuit that is, to a great extent, independent of the machine voltage.

Based on a particularly advantageous further development of the invention, the output voltage is used to operate a driver circuitry, whereby the driver circuitry switches the switching element. The voltage level is significantly higher in this case than that for usual driver circuitries. As a result, the switching element can be switched in a defined manner, whereby the switching characteristics are improved overall. As a result of the output voltage, a reverse polarity protection can be operated, also in addition to a driver circuitry.

The part of a switch-off current from the coil section, that cannot be used for the driver circuitry or the reverse polarity protection is diverted via an electric power component which is connected in parallel to the switching element. A power Z-diode or a bipolar power transistor can be used as a power component to convert the excess switch-off current into heat.

The energy recovery circuitry is ideal for use in electric motors for driving centrifugal pumps or for driving oil mist separators. As a rule, brushless DC motors are used for these applications.

BRIEF DESCRIPTION OF THE SEVERAL VIEWS OF THE DRAWINGS

The exemplary embodiments of the invention are explained in more detail below based on the drawing. The following is shown.

Figure 1:
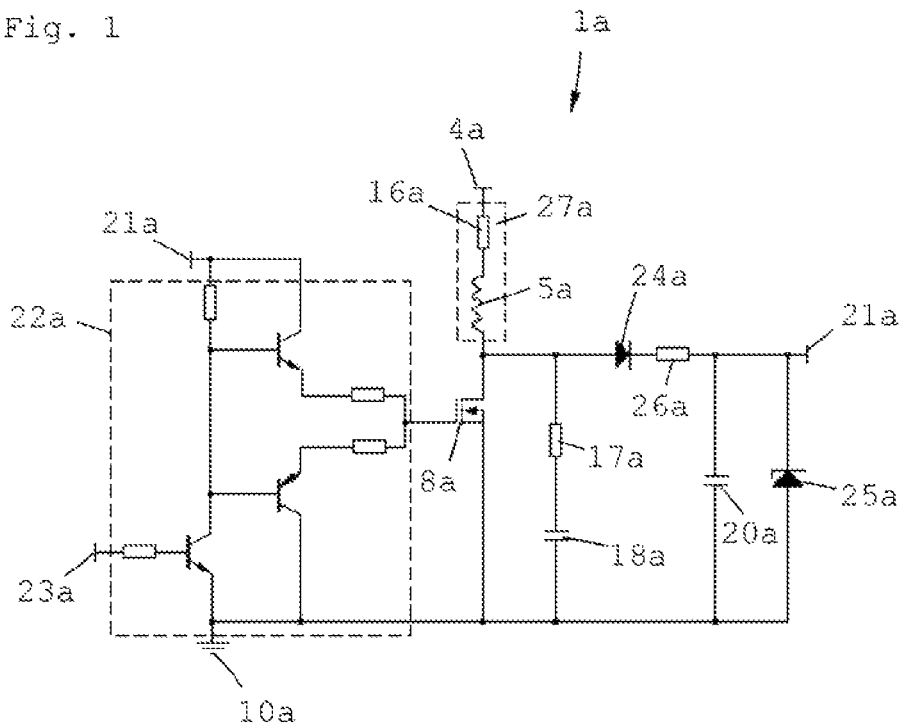
FIG. 1 is a schematic diagram of an energy recovery circuitry.

Note: The reference symbols with index and the corresponding reference symbols without index refer to details with the same name in the drawings and the drawing description. This reflects use in another embodiment or the prior art, and/or where the detail is a variant. For the sake of simplicity, the description contains only reference numbers without an index.

DETAILED DESCRIPTION OF THE INVENTION

In describing preferred embodiments of the present invention illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose.

Figure 4:
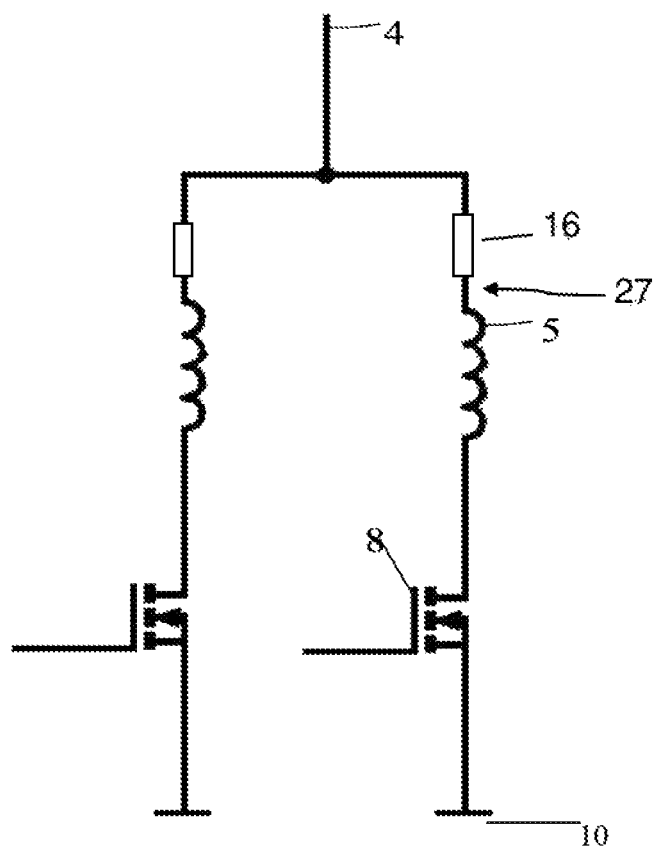
FIG. 4 is a schematic diagram showing a single phase winding, consisting of two coil sections with central connection.

FIG. 1 show energy recovery circuitry according to the invention. FIG. 4 shows in schematic form part of an electric motor with a single phase winding, consisting of two coil sections 5 with central connection. In FIG. 1, an equivalent circuit 27a is shown with a coil section 5a and an equivalent resistance 16*a*. The equivalent circuitry 27*a* only represents a branch of the stator winding. The coil section 5*a* is connected to the motor power supply 4*a*, which, as a rule, in a vehicle application corresponds to the battery voltage. The coil section is, in operating mode, alternately switched on and off via a switching element 8*a*, shown here as a MOSFET. The switching element 8*a* is driven by a driver circuitry 22*a*, which, in turn, is controlled via a control input 23*a* from a circuitry logic. A driver power supply connection 21*a* supplies the gate voltage for the switching element 8*a*. The underlying coil circuitry shown here does not allow overrunning, for this reason when a coil section 5*a* is switched off the energy stored is transferred back to the switching element 8*a*. When the coil section 5*a* is switched off its inductance continues to drive the current in the same direction. As a result the voltage on the diode 24*a* increases until this becomes conductive and a part of the current from the coil section 5*a* flows to a storage capacitor 20*a* via a resistor 26*a*. This charges itself so that a voltage is available.

The voltage on the switching element 8*a* continues to increase up to the breakdown voltage and the current flows in the avalanche mode via the switch channel to ground 10*a*. The major part of the coil energy in switching element 8*a* is thus converted into heat. As already mentioned, a smaller part of the coil energy is diverted to the storage capacitor 20*a* via the diode 24*a* and the resistor 26*a*. As a result the switching element 8*a* is relieved. Voltage peaks are smoothed by the storage capacitor 20*a*. The diode 24*a* prevents the storage capacitor 20*a* from discharging via the coil branch. Parallel to the storage capacitor 20*a* a Z-diode 25*a* ensures a stable voltage of approx. 15 V, which serves as a driver voltage at a driver voltage connection 21*a* to operate the driver circuitry. At a voltage level of 15 V, the switching element can be switched in a defined manner with less losses than with the usual 5 V in the control logic.

In addition a snubber resistor 17*a* and a snubber capacitor 18*a* are shown, which form a snubber network. This results in a clean switching slope and thus has a positive effect on the losses in the transistors and the EMC characteristics.

Figure 2:
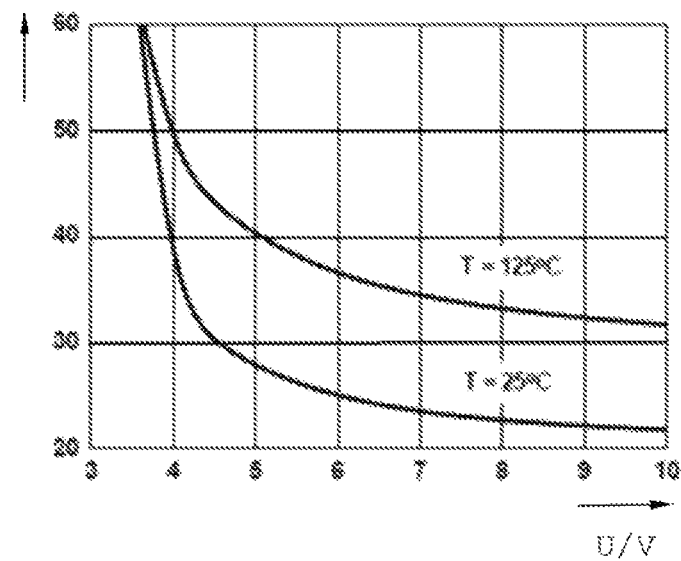
FIG. 2 is a resistance/voltage diagram of a MOSFET.

In FIG. 2 a resistance-gate-voltage diagram of a MOSFET is shown, which demonstrates the relationship between the drain-source-resistance dependent on the gate-source-voltage at various temperatures. The drain-source-resistance drops significantly in the range between 5 and 10 V and continues to drop up to 15 V (cannot be seen here). At a lower drain-source-resistance less heat is generated and the efficiency increased. Furthermore, as a result the gradient of the voltage peaks when switching of the switching element is reduced, as a result, the noise and EMC characteristics are improved. As a result, the breakdown voltage amplitude is limited. Consequently the requirements on the switching elements breakdown strength are reduced. This has a positive effect on the required assembly space and on the economy of the circuitry. Thereby the driver voltage generated is always high enough to switch through the power transistors correctly and in a defined manner. Overall, a much more robust design can be realized with this circuitry design compared to state of the art technologies.

Figure 3:
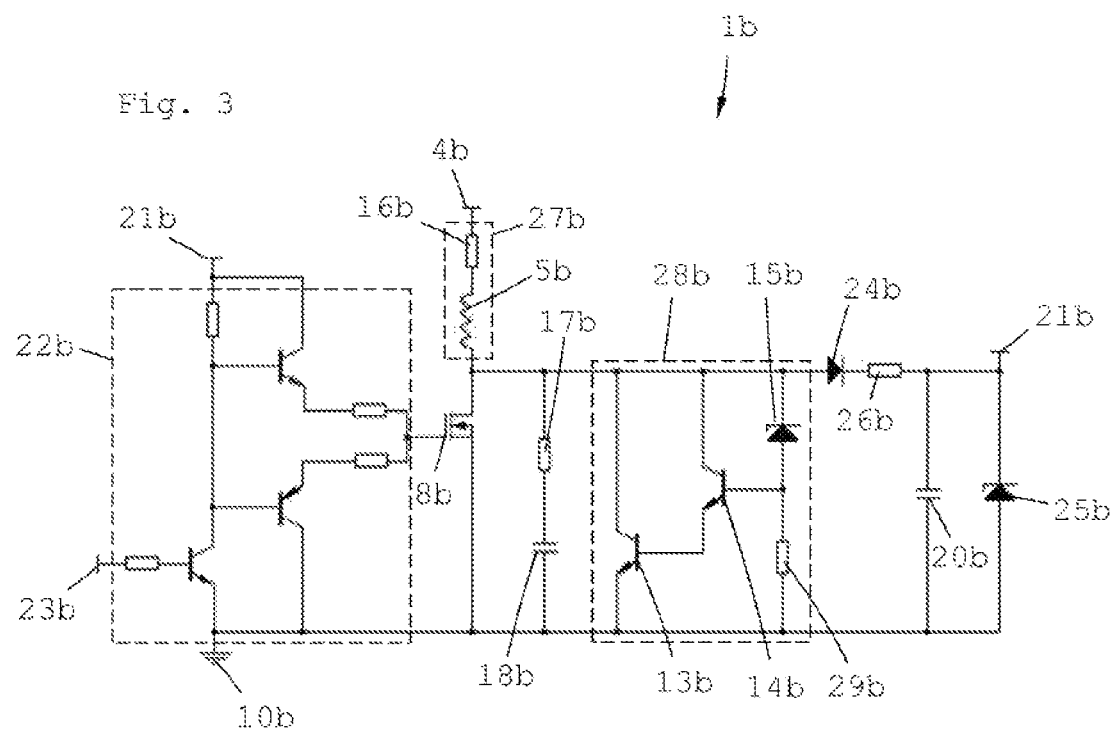
FIG. 3 is a schematic diagram of a variant of the energy recovery circuitry.

FIG. 3 shows an energy recovery circuitry for an electric motor with a single phase winding, consisting of two coil sections with central connection (here only one sector is shown). In FIG. 3 an equivalent circuit 27*b* is shown with a coil section 5*b* and an equivalent resistor 16*b*. The equivalent circuitry 27*b* represents a branch of the stator coil with only one col section. The coil section 5*b* is connected to the motor power supply 4*b*, which, as a rule, in a vehicle application, corresponds to the battery voltage. The coil section 5*b* is, in operating mode, alternately switched on and off via a switching element 8*b*, shown here as a MOSFET. The switching element 8*b* is driven by a driver circuitry 22*b*, which, in turn, is controlled via a control input 23*b* from a circuitry logic. A driver power supply connection 21*b* supplies the gate voltage for the switching element 8*b*. The underlying coil circuitry does not allow overrunning, for this reason when the coil section 5*b* is switched off the energy stored is transferred back to the switching element 8*b*. When the coil section 5*b* is switched off its inductance continues to drive the current in the same direction. As a result the voltage on the diode 24*b* increases until this becomes conductive and a part of the current from the coil section 5*b* flows to a storage capacitor 20*b* via a resistor 26*b*. This charges itself so that a voltage is available. Voltage peaks are smoothed by the storage capacitor 20*b*. The diode 24*b* prevents the storage capacitor 20*b* from discharging via the coil branch. Parallel to the storage capacitor 20*b* a Z-diode 25*b* ensures a stable voltage of ca. 15 V, which serves as a driver voltage at a driver voltage connection 21*b* to operate the driver circuitry. At a voltage level of 15 V the switching element can be switched in a defined manner with less losses than with the usual 5 V in the control logic.

A significant part of the energy released when the coil section 5*b* is switched off cannot be buffered and must be converted to heat. In order not to stress the switching element 8*b* with the heat generated a bypass circuitry 28*b* is recommended. The bypass circuitry 28*b* comprises a control-Z-diode 15*b*, a control resistance 29*b*, a bipolar power transistor 13*b* and a control transistor 14*b*. The basis of the bipolar power transistor 13*b* is connected to the emitter of the control transistor 14*b*. The basis of the control transistor 14*b* is connected to the control-Z-diode 15*b* and the control resistance 29*b*. The control resistance 29*b* serves as a pull-down-resistance and ensures that the control transistor 14*b* is non-conductive in its ground state. When a switch-off impulse occurs, and after a minimum voltage level has been achieved, the control-Z-diode 15*b* pulls the basis voltage of the control transistor 14*b* to a level that renders the control transistor 14*b* conductive. The excess switch-off energy is then conducted away from the bipolar power transistor 13*b* and converted to heat, which is then emitted to the environment.

Overall the bypass circuitry 28*b* acts like a Z-diode, but the power loss limits and the controllability are significantly improved. Due to the magnitude of the basis current of the transistors 14*b*, 13*b* and due to the current gain of the transistors 14*b*, 13*b* the circuitry can be so adapted that the steepness of the signal flanks can be set.

In addition a snubber resistor 17*b* and a snubber capacitor 18*b* are shown, which form a snubber network. This results in a clean switching slope and thus has a positive effect on the losses in the transistors and the EMC characteristics.

Modifications and variations of the above-described embodiments of the present invention are possible, as appreciated by those skilled in the art in light of the above teachings. It is therefore to be understood that, within the scope of the appended claims and their equivalents, the invention may be practiced otherwise than as specifically described.

LIST OF REFERENCE SYMBOLS

1 Energy recovery circuitry
4 Motor power supply voltage (voltage source)
5 Coil section
8 Switching element 10 Ground
13 Bipolar power transistor
14 Control transistor
15 Control-Z-diode
16 Equivalent resistance
17 Snubber resistance
18 Snubber capacitor
20 Storage capacitor
21 Driver power supply connection
22 Driver circuitry
23 Control input (V-gate)
24 Diode
25 Z-Diode
26 Resistance
27 Equivalent circuitry
28 Bypass circuitry
29 Control resistance

What is claimed is:

1. Energy recovery circuitry for an electric motor with a single phase winding, the single phase winding consisting of first and second coil sections with a central connection, each of the first and second coil sections having a coil end, the energy recovery circuitry comprising:
  a ground;
  a diode;
  a storage capacitor; and
  a switching element for connecting the first and second coil ends of the first and second coil sections to ground, and during operation of the circuitry, a part of the energy stored in the first and second coil sections is, when powering down the switching element, diverted via the diode into the storage capacitor that is charged and buffers the recovered energy.

2. The energy recovery circuitry in accordance with claim 1, wherein the buffered energy in the charged storage capacitor generates an output voltage.

3. The energy recovery circuitry in accordance with claim 2, wherein the voltage level of the output voltage is stabilized by a Z-diode connected in parallel to the storage capacitor.

4. The energy recovery circuitry in accordance with claim 2, wherein the output voltage serves as an input voltage for an application, circuitry or partial circuit that is independent of a machine voltage.

5. The energy recovery circuitry in accordance with claim 2, wherein the output voltage serves as a supply voltage for a driver circuit that controls the switching element.

6. The energy recovery circuitry in accordance with claim 2, wherein the output voltage serves as a supply voltage for a reverse polarity protection.

7. The energy recovery circuitry in accordance with claim 1, wherein a major part of the shutdown current from the coil section is diverted via an electrical power component that is connected in parallel to the switching element.

8. The energy recovery circuitry according to claim 7, wherein each coil section has a cut-off current and the cut-off current of each coil section can be controlled.

9. The energy recovery circuitry, according to claim 7, wherein the power component is a power Z-diode.

10. The energy recovery circuitry, according to claim 7, wherein the power component is a bipolar power transistor.

11. The energy recovery circuitry, according to claim 1, wherein the switching element is a field effect transistor.

12. The energy recovery circuitry, according to claim 1, wherein the switching element is a bipolar transistor.

13. Electric centrifugal pump with an energy recovery circuitry according to claim 1.

14. Electric oil mist separator with an energy recovery circuitry according to claim 1.

* * * * *